United States Patent
Nielsen et al.

(10) Patent No.: US 8,212,561 B2
(45) Date of Patent: Jul. 3, 2012

(54) FAST VELOCITY MEASUREMENTS USING BALANCED SSFP MAGNETIC RESONANCE IMAGING

(75) Inventors: Jon-Fredrik Nielsen, West Bloomfield, MI (US); Krishna S. Nayak, Los Angeles, CA (US)

(73) Assignee: University of Southern California, Los Angeles, CA (US)

(*) Notice: Subject to any disclaimer, the term of this patent is extended or adjusted under 35 U.S.C. 154(b) by 282 days.

(21) Appl. No.: 12/582,437

(22) Filed: Oct. 20, 2009

(65) Prior Publication Data

US 2010/0109665 A1 May 6, 2010

Related U.S. Application Data

(60) Provisional application No. 61/106,791, filed on Oct. 20, 2008.

(51) Int. Cl.
*G01V 3/00* (2006.01)
(52) U.S. Cl. ..................................... 324/309
(58) Field of Classification Search .......... 324/300–322; 600/407–435
See application file for complete search history.

(56) References Cited

U.S. PATENT DOCUMENTS

| | | | |
|---|---|---|---|
| 4,769,603 A | 9/1988 | Oppelt et al. | |
| 5,093,619 A * | 3/1992 | Hennig | 600/521 |
| 6,552,542 B1 | 4/2003 | Overall | |
| 6,750,651 B2 * | 6/2004 | Overall | 324/309 |
| 6,806,709 B2 | 10/2004 | Markl et al. | |
| 2006/0161060 A1 | 7/2006 | Pai | |
| 2007/0257671 A1 * | 11/2007 | Nayak et al. | 324/307 |

OTHER PUBLICATIONS

Simpler algorithm, available at http://en.wikipedia.org/wiki/SIMPLE_algorithm on Oct. 6, 2011.*
Edelman et al., Clinical Magnetic Resonance Imaging, 2nd ed., vol. 1, chapter 9, MR Angiography: Basic Principles, pp. 285-301 (1996).*
Grinstead J. et al. 2005. In-Plane Velocity Encoding with Coherent Steady-State Imaging. Magnetic Resonance in Medicine 54: 138-145.
Man L-C et al. 1999. Nonsubtractive Spiral Phase Contrast Velocity Imaging. Magnetic Resonance in Medicine 42: 704-713.
Markl M. et al. 2003. Flow Effects in Balanced Steady State Free Precession Imaging. Magnetic Resonance in Medicine 50: 892-903.

(Continued)

*Primary Examiner* — Melissa Koval
*Assistant Examiner* — Daniel Miller
(74) *Attorney, Agent, or Firm* — McDermott Will & Emery LLP (57) ABSTRACT

Referenceless techniques for flow imaging are described that exploit a refocusing property of balanced steady state free precession ("SSFP") magnetic resonance imaging ("MRI"), and achieve up to approximately a 50% reduction in total scan time. With the echo time set to one half of the sequence repetition time (TE=TR/2), non-flow-related image phase tends to vary smoothly across the field-of-view, and can be estimated from static tissue regions to produce a phase reference for nearby voxels containing flowing blood. These approaches produce accurate in vivo one-dimensional velocity estimates in half the scan time compared with conventional balanced SSFP phase-contrast methods. The feasibility of referenceless time-resolved 3D flow imaging (called "7D" flow) is demonstrated for a carotid bifurcation application from just three acquisitions. Related systems are also described. Other attributes such as blood acceleration can also be imaged with such techniques.

26 Claims, 7 Drawing Sheets

OTHER PUBLICATIONS

Markl M. et al. 2003. Balanced Phase-Contrast Steady-State Free Precession (PC-SSFP): A Novel Technique for Velocity Encoding by Gradient Inversion. Magnetic Resonance in Medicine 49: 945-952.).

Markl M. et al. 2004. On Flow Effects in Balanced Steady-State Free Precession Imaging: Pictorial Description, Parameter Dependence, and Clinical Implications. Journal of Magnetic Resonance Imaging 20: 697-705.

Nielsen J-F. et al. 2006. Pulse Sequences for Phase-Contrast SSFP Imaging from a Single Steady-State. Proc. Intl. Mag. Reson. Med. 14: 879.

Overall W.R. et al. 2002. Fast Phase-Contrast Velocity Measurement in the Steady State. Magnetic Resonance in Medicine 48: 890-898.

Scheffler K. et al. 2003. Is TrueFISP a Gradient-Echo or a Spin-Echo Sequence? Magnetic Resonance in Medicine 49: 395-397.

* cited by examiner

FAST VELOCITY MEASUREMENTS USING BALANCED SSFP MAGNETIC RESONANCE IMAGING

CROSS-REFERENCE TO RELATED APPLICATION

This application is based upon and claims priority to U.S. Provisional Patent Application No. 61/106,791, entitled "Fast Method for Velocity Measurements Using SSFP Magnetic Resonance Imaging," filed 20 Oct. 2008, client reference no. 09-080, the entire contents of which are incorporated herein by reference.

STATEMENT REGARDING FEDERALLY SPONSORED RESEARCH

This invention was made with Government support under grant numbers R01-HL074332 and R21-HL079987 awarded by National Institutes of Health. The Government has certain rights in the invention.

BACKGROUND

Phase-contrast (PC) magnetic resonance imaging ("MRI") is an established technique for measuring blood velocities in vivo and is in wide clinical use. Conventional PC-MRI is based on spoiled gradient recalled echo ("GRE") pulse sequences, which provide consistent image quality. PC MRI techniques have been developed that are based on balanced steady state free precession (SSFP) sequences, which provide accurate velocity measurements with superior signal to noise ratio ("SNR") efficiency.

Rapid imaging sequences or steady-state free precession (abbreviated, "SSFP") sequences acquire imaging data in a dynamic equilibrium state (i.e., the so called "steady-state"). Due to the heavy requirements on system performance, these types of SSFP sequences were not in use until recently. Presently, such imaging sequences have become increasingly popular due to their very fast scanning properties, which are necessary for imaging fast dynamic processes, in abdominal imaging, in cardiac imaging, or when imaging very ill and traumatized patients. There are many different types of steady-state imaging sequences, and a special member of this group is obtained if the time integral of each of the three gradients is zero—e.g. "balanced"—within each repetition time (TR). Such a pulse sequence is disclosed, for example, as FIG. 3 in U.S. Pat. No. 4,769,603, the entire contents of which are incorporated herein by reference.

Such approaches typically involve the acquisition of two or more complete datasets, where at least one serves as a phase reference. The requirement for acquiring multiple datasets limits the spatio-temporal resolution obtainable within a given total imaging time, and impedes real-time imaging. In addition, the acquisition of multiple datasets can present inconveniences and discomfort for MRI subjects.

SUMMARY

Embodiments of the present disclosure are directed to techniques, including systems, methods, and software or computer program products, utilizing a referenceless approach to flow imaging that utilizes a refocusing property of balanced SSFP, and achieves up to a 50% reduction in total scan time.

Embodiments of the present disclosure can improve upon shortcoming of other techniques by setting the echo time to exactly one half of the sequence repetition time (TE=TR/2) (or approximately so). It is shown that non-flow-related image phase tends to vary smoothly across the field-of-view, and can be estimated from static tissue regions to produce a phase reference for nearby voxels containing flowing blood. This approach produces accurate in vivo one-dimensional velocity estimates in approximately half the scan time compared with conventional balanced SSFP phase-contrast methods. Other estimates, e.g., acceleration, can also be made by embodiments of the present disclosure. Acceleration is only one example, but there may be other information (known or discovered in the future) that can be encoded in the phase of the MRI signal, and will benefit from the same reference-less approach described herein. Also described is an embodiment directed to referenceless time-resolved 3D flow imaging (called "7D" flow) in the carotid bifurcation from just three acquisitions. Thus, embodiments of the present disclosure can provide for quicker 3D flow imaging.

These, as well as other components, steps, features, objects, benefits, and advantages of the present disclosure, will now become clear from a review of the following detailed description of illustrative embodiments, the accompanying drawings, and the claims.

BRIEF DESCRIPTION OF DRAWINGS

The drawings disclose illustrative embodiments. They do not set forth all embodiments. Other embodiments may be used in addition or instead. Details that may be apparent or unnecessary may be omitted to save space or for more effective illustration. Conversely, some embodiments may be practiced without all of the details that are disclosed. When the same numeral appears in different drawings, it refers to the same or like components or steps.

Aspects of the disclosure may be more fully understood from the following description when read together with the accompanying drawings, which are to be regarded as illustrative in nature, and not as limiting. The drawings are not necessarily to scale, emphasis instead being placed on the principles of the disclosure. In the drawings.

While certain embodiments are depicted in the drawings, one skilled in the art will appreciate that the embodiments depicted are illustrative and that variations of those shown, as well as other embodiments described herein, may be envisioned and practiced within the scope of the present disclosure.

DETAILED DESCRIPTION OF ILLUSTRATIVE EMBODIMENTS

Illustrative embodiments are now discussed. Other embodiments may be used in addition or instead. Details that may be apparent or unnecessary may be omitted to save space or for a more effective presentation. Conversely, some embodiments may be practiced without all of the details that are disclosed.

Embodiments of the present disclosure are directed to referenceless velocity mapping approaches based on balanced SSFP MRI. Such techniques take advantage of the intrinsic refocusing property of balanced SSFP when the echo time is set to exactly one half of the sequence repetition time (TE=TR/2). Phase-accrual because of resonance offsets is refocused at this point in time. The image phase in static tissue regions therefore depends only on system-related sources of phase, such as complex receive coil sensitivities, time-delays between gradients and data acquisition, and eddy-current and Maxwell terms. These phase terms vary slowly across the imaging field-of-view (FOV), and can be approximated using a smooth (e.g. low order polynomial) fit in a region of interest (ROI) in static tissue that is then subtracted from the entire image. The remaining image phase depends only on local spin velocity and the gradient first moment at the echo. By subtracting the approximated (modeled) image phase of the ROI of static tissue from the image phase of the FOV, velocity mapping or estimation can be performed in less time than other techniques. Other estimates, e.g., acceleration, can also be made by embodiments of the present disclosure. Acceleration is only one example, but there may be other information (known or discovered in the future) that can be encoded in the phase of the MRI signal, and will benefit from the same reference-less approach described herein.

Such referenceless approaches can produce accurate in vivo 1D velocity estimates in half the scan time compared with conventional SSFP phase-contrast methods. Also demonstrated are applications of such methods to 3D time-resolved flow imaging ("7D" flow) in the carotid bifurcation from only three acquisitions.

Figure 1:
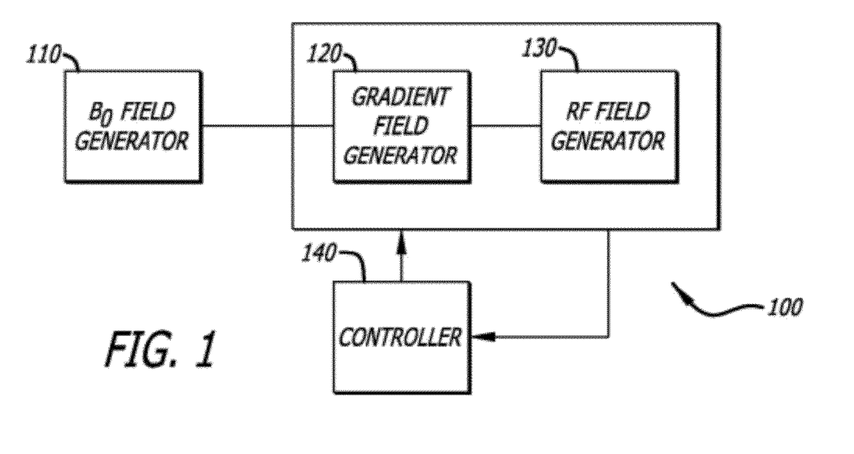
FIG. 1 depicts a schematic box diagram of a system in accordance with an exemplary embodiment of the present disclosure.

FIG. 1 illustrates a functional block diagram that provides a schematic overview of an MRI apparatus 100 in accordance with one embodiment of the methods and systems described in the present disclosure. Briefly, the apparatus 100 includes a static field generator 110, a gradient field generator 120, an RF excitation field generator 130, and a controller 140 that controls the operation of the gradient field generator 120 and the RF excitation field generator 130. The controller also analyzes or processes the FID (free induction decay) signals received by a receiver (not shown).

The static field generator 110 generates a strong static magnetic field $B_0$, which is used to line up nuclear spins in a target object (whose MRI image is being generated by the apparatus 100) along $B_0$. The gradient field generator 120 generates a gradient field $G(r)$, which is superimposed on the static field $B_0$, so that nuclei in a selected plane can be excited by a proper choice of the frequency spectrum of the transverse RF excitation field. The RF excitation field generator 130 generates an RF excitation field B1. When B1 is applied to the object, typically as an RF excitation pulse transverse to $B_0$, the nuclei become excited (due to the RF energy imparted by the RF excitation pulse), so that the nuclear spins rotate by a flip angle. Subsequently, the excited nuclei gradually return to alignment with the static field $B_0$, giving up the excitation energy in the form of weak but detectable FID signals, which are processed by the controller 140 to produce images of the target object.

The controller 140 controls the operation of the MRI apparatus 100, including but not limited to the generation of the fields $G(r)$, and B1, as well as the processing of the FID signals resulting from the de-excitation (precession and relaxation) of the nuclei in the object.

Exemplary embodiments of the present disclosure were applied to both single-slice 1D and volumetric 3D velocity mapping, using balanced SSFP acquisitions with TE=TR/2.

Figure 2:
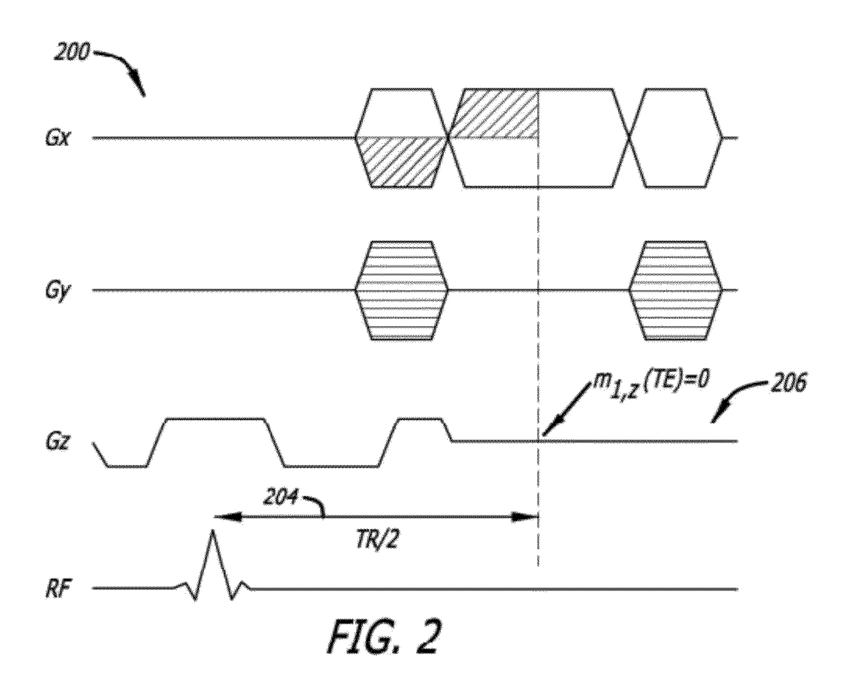
FIG. 2 shows a 2DFT acquisition for single-slice 1D velocity mapping along the readout direction, in accordance with an exemplary embodiment of the present disclosure.

FIG. 2 shows a 2DFT acquisition 200 for single-slice 1D velocity mapping along the readout (x) direction, in accordance with an exemplary embodiment of the present disclosure. As shown in the figure, the gradient first moment $m_{1,z}$ in the through-slice (z) direction is nulled at the echo. The shaded region indicates the gradient area responsible for flow encoding; note that it is the readout gradient itself that encodes velocity, and not an additional bipolar pulse.

Figure 3:
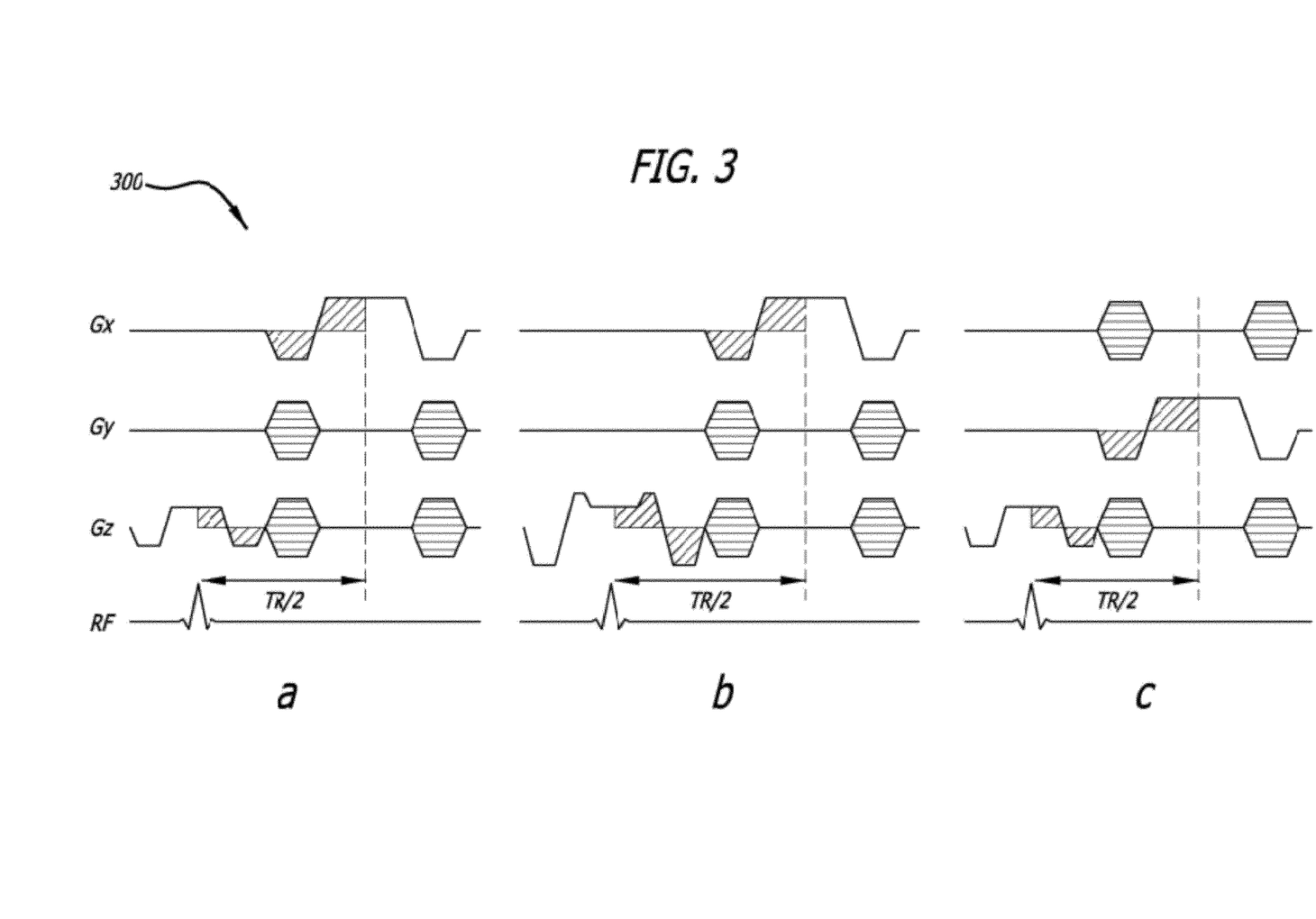
FIG. 3 shows three 3DFT acquisitions used for volumetric mapping of full velocity vectors, in accordance with an exemplary embodiment of the present disclosure.

FIG. 3 shows a set 300 of three 3DFT acquisitions (a)-(c) used for volumetric mapping of full velocity vectors, in accordance with a further exemplary embodiment. Each acquisition had a different gradient first moment at the echo: Acquisition A has non-zero $m_{1,x}^A$ and $m_{1,z}^A$; acquisition B has non-zero $m_{1,x}^B$ and $m_{1,z}^B$; and acquisition C has non-zero $m_{1,y}^C$ and $m_{1,z}^C$.

Background Phase Subtraction

In each 2DFT/3DFT dataset, 2D/3D regions-of-interest (ROIs) were defined manually inside static tissue and in close proximity to the vessel or structure (e.g., a heart) of interest. Care was taken to exclude fat from these ROIs, because fat may be in an SSFP band where the phase is refocused to $\pi$ rather than 0, due to the fat/water chemical shift (−440 Hz at 3T). The image phase $\Theta(r)$ inside the ROIs was fitted to a low-order 2D/3D polynomial, using the mean-squared error as a goodness-of-fit criterion. A low-order polynomial was chosen because it has been shown to provide a good local fit to the smoothly varying background phase in MRI images. While polynomial functions of low order can be used, other suitable modeling functions may of course be used. Finally, the polynomial phase fit was subtracted from the image phase, resulting in a phase image that depends only on the gradient first moment at the echo and the local spin velocity.

Experimental Methods

All experiments were performed in healthy volunteers on a commercial 3T scanner (Signa Excite HD, GE Healthcare, Waukesha, Wis.) with maximum gradient amplitude and slew rate of 40 mT/m and 150 T/m/s, respectively, and with 250 kHz receiver bandwidth. All subjects provided informed consent, and were scanned using a protocol approved by the inventors' Institutional Review Board ("IRB"). Table 1 summarizes the scan parameters used in the three experiments described below.

In the 2DFT imaging experiments, the RF and imaging gradients were applied continuously, such that a steady state was reached for static spins. To mitigate RF heating in the 7D flow experiment, acquisition was triggered by each ECG R-wave, and occurred for only the first half of each cardiac cycle. A 8-TR Kaiser-ramp preparation was used to minimize transient signal oscillations:

Experiment 1: Smoothness of Background Phase

To assess the nature of background phase patterns in clinical MRI velocity mapping applications, balanced 2DFT SSFP images were obtained in the femoral bifurcation using a single-channel birdcage quadrature knee coil; in the carotid bifurcation using a 4-channel carotid surface coil array; and in the abdominal aorta using an 8-channel cardiac surface coil array. The phase in single-coil images from each of these acquisitions was fitted to polynomials of order 1 through 4, and the goodness-of-fit was evaluated.

Experiment 2: Accuracy of Velocity Measurements

To assess the performance of the proposed approach compared to conventional SSFP PC-MRI, single-slice 1D velocity mapping of the common carotid artery was performed in one healthy volunteer using the sequence in FIG. 2. The common carotid artery was oriented in-plane, with the readout (x) oriented along the S/I direction. A total of 20 images were acquired: 10 images were acquired with a positive readout gradient during data acquisition (solid "Gx" line in FIG. 2), and 10 images were acquired with the readout gradient inverted (dotted "Gx" line in FIG. 2). This data was then reconstructed in two ways: First, 10 PC maps were generated by performing conventional PC processing, i.e., by calculating the phase-difference between two images acquired with opposite sign of the readout gradient. This corresponds to the gradient inversion method proposed by Markl et al., applied to velocity encoding along the readout direction, as implemented by Grinstead and Sinha.

Constant and linear background offsets were removed from each of the 10 PC images, by performing a linear plane fit to the same static ROI that was used for referenceless velocity mapping. Second, 20 velocity maps were calculated using the proposed referenceless processing, by calculating the velocity directly from the residual image phase:

$$\Theta(r) = \gamma v_x(r) m_{1,x}(TE) \quad (EQ. 1)$$

Note that flow along the phase-encode (y) direction does not affect the image phase, but rather manifests as a spatial shift along y. For example, for a square phase-encode gradient pulse of amplitude 2 G/cm and a spatial resolution of 1 mm, a velocity of 100 cm/s along the phase-encode direction will result in a shift of 0.29 pixels.

TABLE 1

Scan Parameters for the Three Experiments Performed in This Study

Figure 4A:
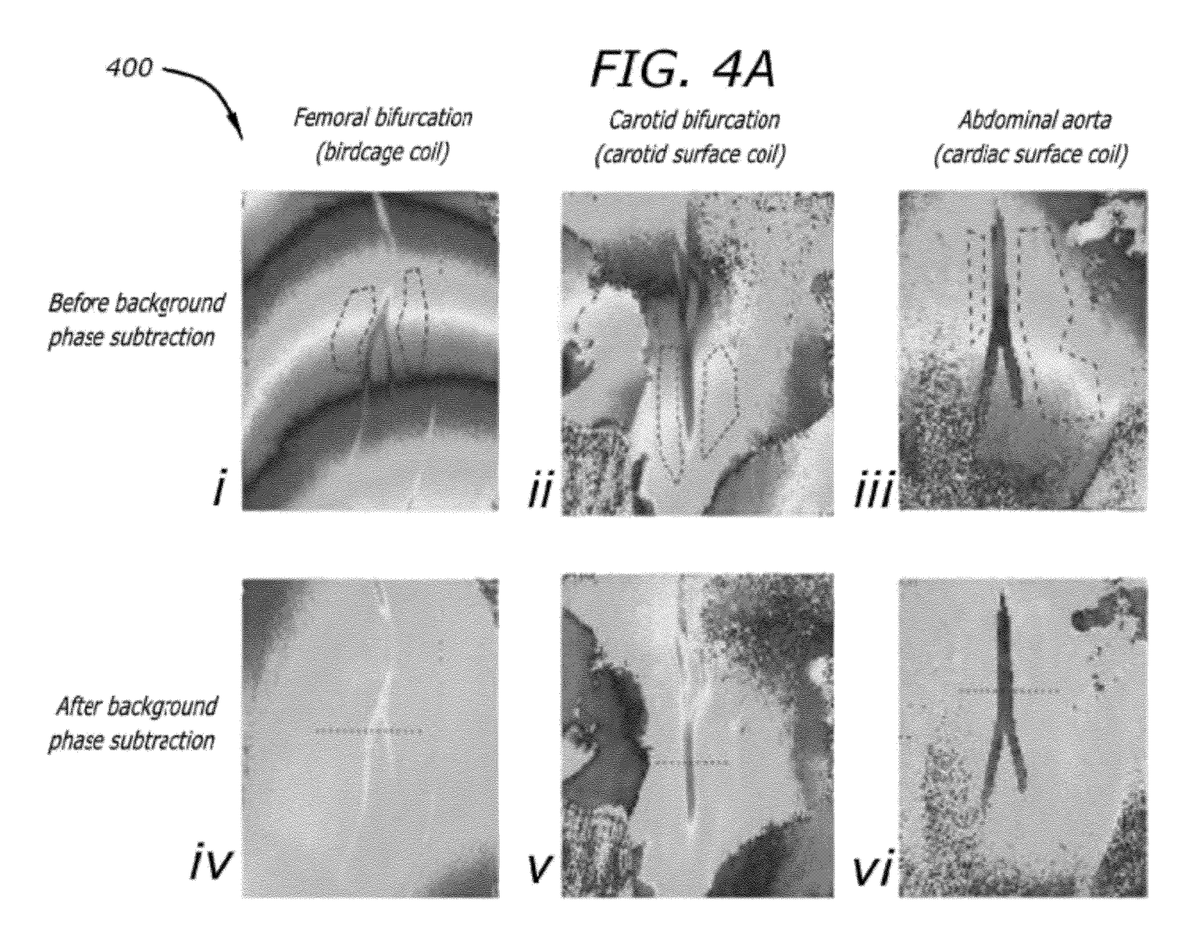
FIG. 4 shows the image phase for three different vascular regions at the time of peak flow, in accordance with an exemplary embodiment of the present disclosure.
Figure 4B:
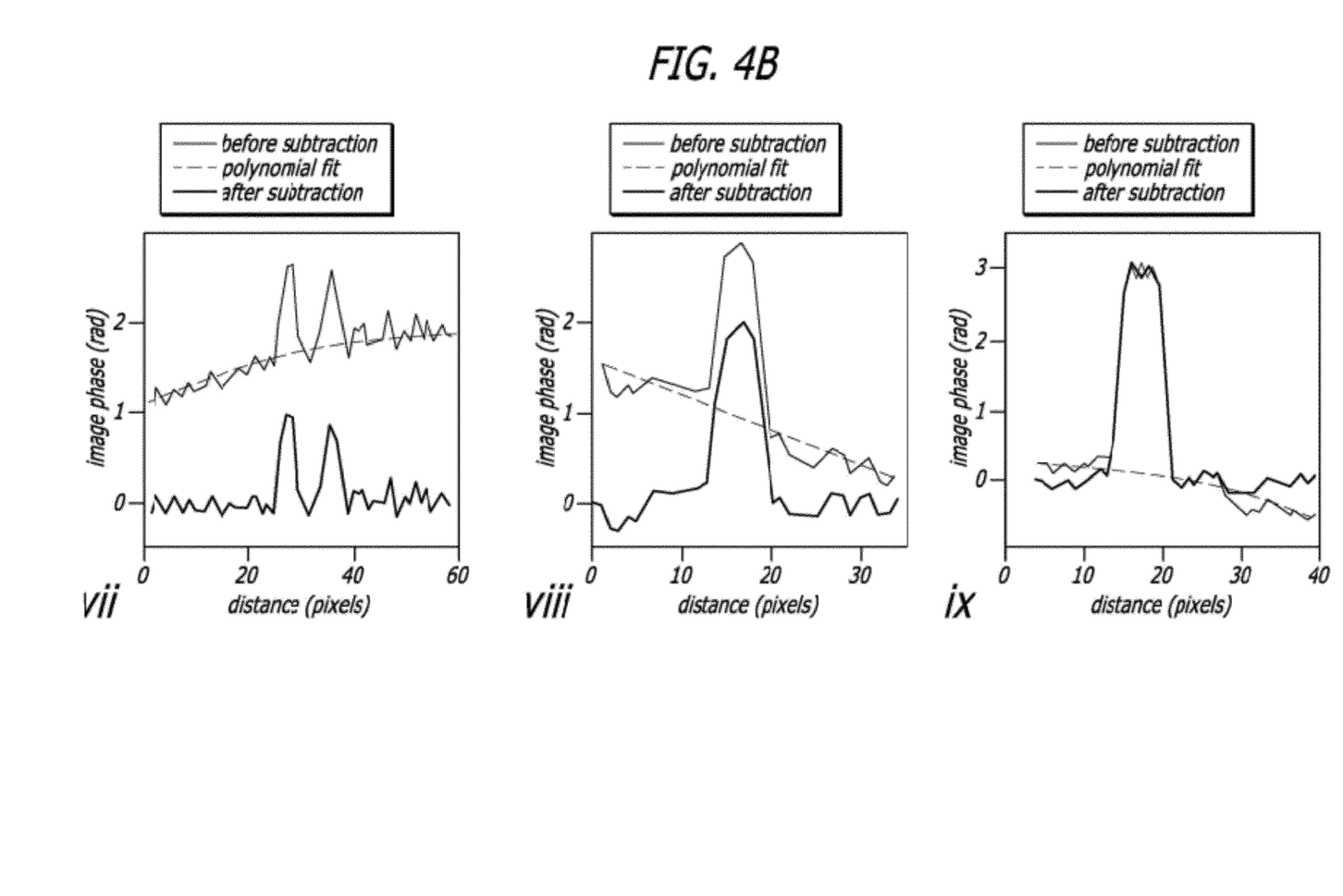
Figure 5:
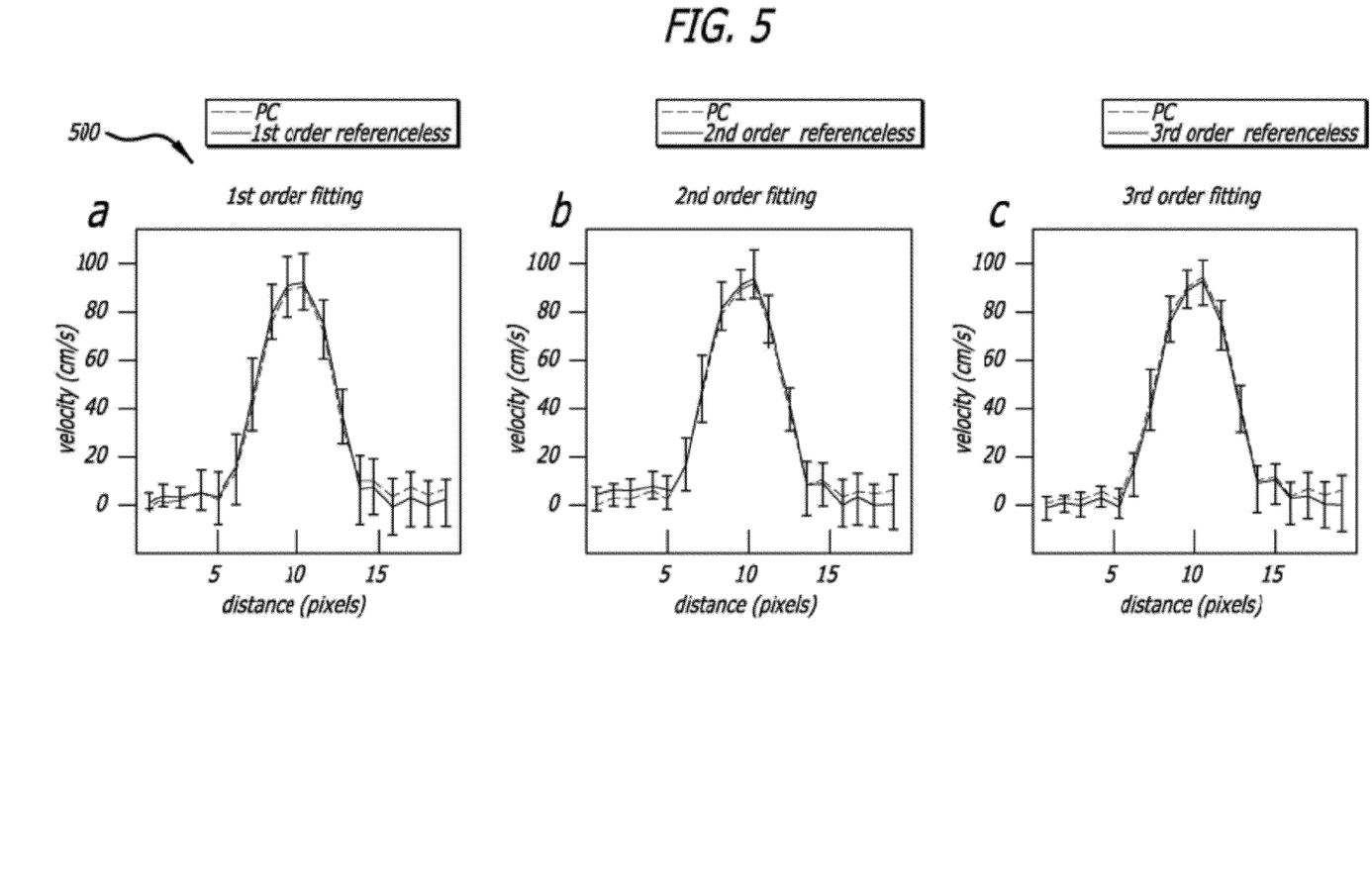
FIG. 5 summarizes results of performing 1 D velocity mapping in the common carotid artery of a healthy volunteer, using phase contrast ("PC") processing with either 1st, 2nd, or 3rd order polynomial fitting, in accordance with an exemplary embodiment of the present disclosure.
Figure 6:
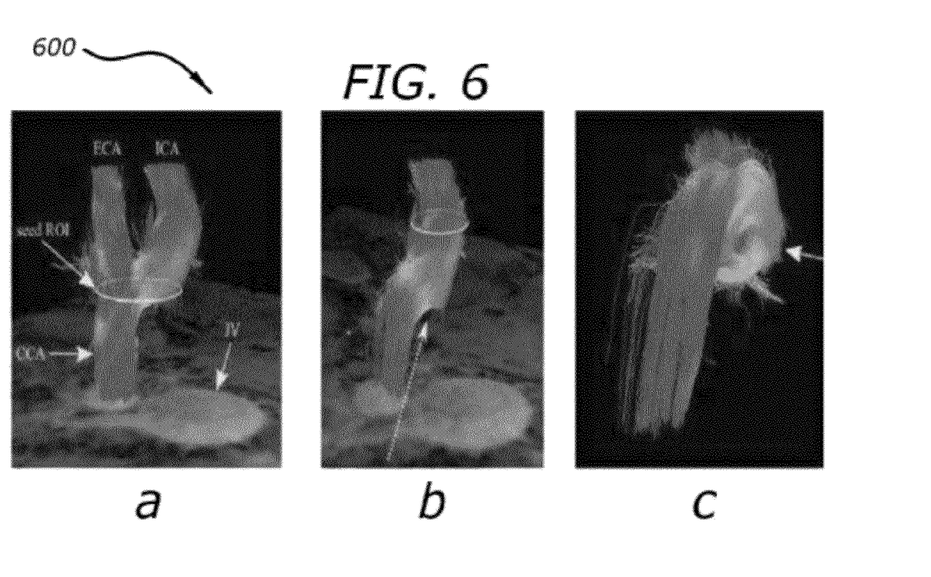
FIG. 6 shows velocity streamlines calculated from 7D flow measurements in the carotid bifurcation of a healthy volunteer, using data from one receive channel, in accordance with an exemplary embodiment of the present disclosure.

| | Experiment 1 Background Phase | Experiment 2 Accuracy | Experiment 3 7D flow |
|---|---|---|---|
| Pulse sequence | 2DFT SSFP (FIESTA) | FIG. 2 | FIG. 3 |
| Receive coil | Knee; carotid; cardiac | Carotid | Carotid |
| TE/TR | 2.506/5.012 ms | 2.978/5.956 ms | 3.322/6.644 ms |
| Matrix size | 160 × 160 | 160 × 160 | 160 × 120 × 30 |
| FOV | 16 × 16 cm² | 16 × 16$^a$ cm² | 16 × 12 × 6 cm3 |
| Slice/slab thickness | 7 mm | 7 mm | 60 mm |
| Voxel size | 1 × 1 × 7 mm³ | 1 × 1 × 7 mm³ | 1 × 1 × 2 mm3 |
| Readout direction | S/I | S/I | R/L and A/P |
| Flip angle | 50° | 40° | 50° |
| RF phase cycling | (0°, 180°) | (0°, 180°) | (0°, 180°) |
| Views per cardiac phase | 8 | 8 | 8 |
| Total scan duration | 20 sec | 20 sec per repetition | 22 mins |
| Transient catalyzation | none | none (continuous) | 8-tip Kaiser ramp |
| Results | FIG. 3 and Table 2 | FIG. 4 and Table 3 | FIGS. 5 and 6 |

$^a$When imaging the abdominal aorta, an FOV of 16 × 35 cm² was used.

Velocity estimates from the two methods were compared in terms of accuracy and velocity SNR. The noise $\sigma_v$ in the 1D velocity maps obtained with the proposed method is determined by the phase noise $\sigma$ in the SSFP image, and by the gradient first moment at the echo:

$$SNR_v = \frac{v}{\sigma_v} = \frac{\Theta}{\sigma_\Theta} \quad (EQ. 2)$$

In this experiment, the maximum encoded velocity (VENC) for PC reconstruction is half of that of the referenceless reconstruction, which results in twice the velocity signal. Subtracting two phase images with uncorrelated phase noise $\sigma_\Theta$ results in a $\sqrt{2}$ increase in the phase noise $\sqrt{\sigma_\Theta^2 + \sigma_\Theta^2} = \sqrt{2}\sigma_\Theta$ for PC reconstruction. The velocity SNR for PC and referenceless velocity mapping is therefore expected to follow:

$$SNR_v^{PC} = \frac{v^{PC}}{\sigma_v^{PC}} = \frac{2\Theta}{\sqrt{2}\,\sigma_\Theta} = \sqrt{2}\,SNR_v \quad (EQ. 3)$$

where $SNR_v$ and $SNR_v^{PC}$ represent the velocity SNR for the proposed method and PC, respectively. Velocity noise was calculated for each pixel within the static ROI by calculating the standard deviation of all 10 (PC) or 20 (referenceless) measurements. The final noise estimate was obtained by calculating the mean noise and standard error of the mean noise from all pixels within the ROI.

Experiment 3: Feasibility of Referenceless 7D Velocity Mapping

To determine whether referenceless SSFP velocity imaging could be applied to flow field measurements, time resolved 3D velocity mapping was performed in the carotid bifurcation of a healthy volunteer, using the sequences in FIG. 3. The imaging slab was oriented axially, with partition-encoding (z) oriented along the S/I direction. The velocity was calculated from the image phase in each of the three acquisitions:

$$\Theta^A = \gamma v_x m_{1_x}^A + \gamma v_z m_{1_z}^A \quad (EQ. 4)$$

$$\Theta^B = \gamma v_x m_{1_x}^B + \gamma v_z m_{1_z}^B \quad (EQ. 5)$$

$$\Theta^C = \gamma v_y m_{1_y}^C + \gamma v_z m_{1_z}^C \quad (EQ. 6)$$

Equations 4-6 were solved for the velocity vector components $v_x$, $v_y$, and $v_z$, resulting in a volumetric data set with a 3D velocity vector for each voxel at each time step. This data set was visualized in two ways: (1) By producing 3D flow streamlines at the time of peak flow and (2) by generating time-resolved particle traces ("pathlines"). Streamlines were generated by selecting a set of seed points, and drawing line segments of length 0.2 pixels successively along the direction of the local velocity vector. To facilitate these calculations, a continuous velocity vector field was generated from the discrete 160×120×30 velocity grid by trilinear interpolation between the nearest grid points. Each streamline was terminated if the local streamline angle exceeded 30°. Pathlines were calculated in a similar manner, except that the step size reflected the physical distance traveled by a massless particle moving with the fluid. By interrupting the pathlines at different points in time, a movie was generated depicting the physical fluid flow. Streamline and pathline results were visualized using a graphical software tool built in-house using Java.

Results

Smoothness of Background Phase

FIG. 4 includes a set 400 of graphs i-ix that show the image phase for three different vascular regions at the time of peak flow, in accordance with an exemplary embodiment of the present disclosure. As can be discerned from 400, before background phase subtraction, the phase in static tissue is substantial. After fitting a smooth function to phase within the marked ROIs and subtracting this fit from the entire image, the residual phase in static tissue is close to zero. Table 2 lists the phase standard deviation inside static ROIs after polynomial fitting of order 1, 2, 3, and 4, for three different anatomical regions, and for two different subjects for each anatomical region.

The least-squares fitting routine used can result in mean errors over the background ROI that are close to zero regardless of polynomial order, and therefore the phase RMS value may be selected as a measure of goodness-of-fit. Generally, the goodness-of-fit increases with higher order fitting. However, 4th order fitting produces only marginal improvements over 3rd order fitting. Furthermore, in each case the phase standard deviation for 2nd order fitting was within 11% of the value obtained with 3rd order fitting. These results indicate that local background phase can typically be adequately approximated by a 3rd or lower order polynomial for the carotid and femoral bifurcations and the abdominal aorta; most other locations may be expected to provide similar results.

TABLE 2

Phase Standard Deviation (Radians) in Static Tissue ROIs Following Polynomial Fitting (Experiment 1)

|  | 1st Order | 2nd Order | 3rd Order | 4th Order |
|---|---|---|---|---|
| Femoral artery, subject 1 | 0.154 | 0.116 | 0.111 | 0.110 |
| Femoral artery, subject 2 | 0.130 | 0.111 | 0.110 | 0.110 |
| Carotid artery, subject 1 | 0.123 | 0.112 | 0.101 | 0.095 |
| Carotid artery, subject 2 | 0.162 | 0.148 | 0.141 | 0.133 |
| Abdominal aorta, subject 1 | 0.206 | 0.161 | 0.147 | 0.147 |
| Abdominal aorta, subject 2 | 0.217 | 0.211 | 0.203 | 0.198 |

Accuracy of Velocity Measurements

FIG. 5 includes a set 500 of graphs (a)-(c), which summarize the results of performing 1D velocity mapping in the common carotid artery of a healthy volunteer, using PC processing and the proposed method with either 1st, 2nd, or 3rd order polynomial fitting, in accordance with an exemplary embodiment of the present disclosure. The error bars indicate the standard deviation over all 10 measurements (for PC) or 20 measurements (for the proposed method). In all cases, referenceless velocity estimates inside the vessel lumen are in good agreement with the PC values.

Table 3 lists the measured velocity noise for referenceless and PC imaging. The noise increase due to referenceless processing is close to the theoretically expected value of square root of 2.

TABLE 3

Velocity Noise for PC and Referenceless Measurements (Experiment 2)

|  | PC | 1st Order | 2nd Order | 3rd Order |
|---|---|---|---|---|
| $\sigma_v$(cm/s) | 6.87 +− 0.89 | 11.26 +− 0.92 | 10.13 +− 0.80 | 9.83 +− 0.80 |
| $\sigma_v/\sigma_v^{PC}$ | 1 | 1.64 +− 0.25 | 1.47 +− 0.23 | 1.43 +− 0.22 |

Note:
The theoretically expected noise increase due to referenceless processing is 1.414 (see Eq. [3]).

Feasibility of Referenceless 7D Velocity Mapping

FIG. 6 include views (a)-(c) which together show a set 600 of velocity streamlines calculated from 7D flow measurements in the carotid bifurcation of a healthy volunteer, using data from one receive channel, in accordance with an exemplary embodiment of the present disclosure. The streamlines are color-coded such that the red, green, and blue components equal $v_x/|v|$, $v_y/|v|$, and $v_z/|v|$, respectively, where $|v|=\sqrt{v_x^2+v_y^2+v_z^2}$. Blood flow is clearly observed through the common carotid artery (CCA), and subsequently through the internal and external carotid arteries. FIG. 6c nicely shows rotational flow originating in the carotid bifurcation, which is a normally occurring flow pattern in healthy individuals.

Figure 7:
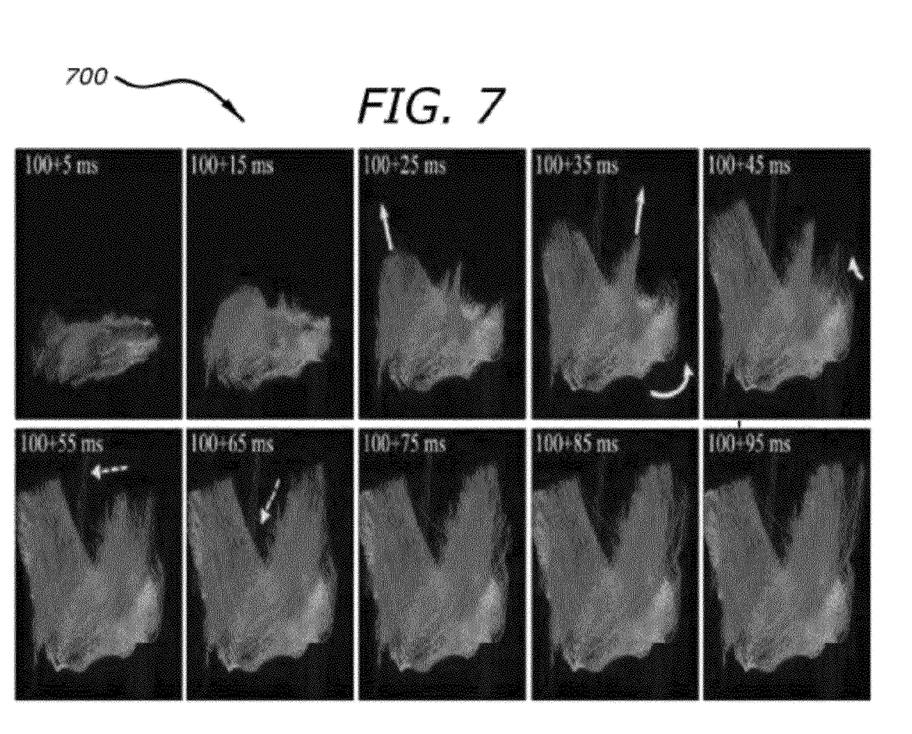
FIG. 7. shows pathlines generated from a 7D flow dataset, during a 95 ms systolic time period, in accordance with an exemplary embodiment of the present disclosure.

FIG. 7 include multiple views that depict a set 700 of pathlines generated from the 7D flow dataset, during a 95 ms systolic time-period. Flow in the ECA is mostly vertical (blue) and unidirectional (100+25 ms, arrow). Flow in the ICA is more complex, and appears to consist of two separate paths: (1) Rotational flow (100+35 ms, curved arrow), and (2) simpler, mostly upward flow in the lumen interior (100+35 ms, straight arrow). At 100+45 ms, the curved pathlines switch direction rapidly upwards (100+45 ms, curved arrow).

Figure 8:
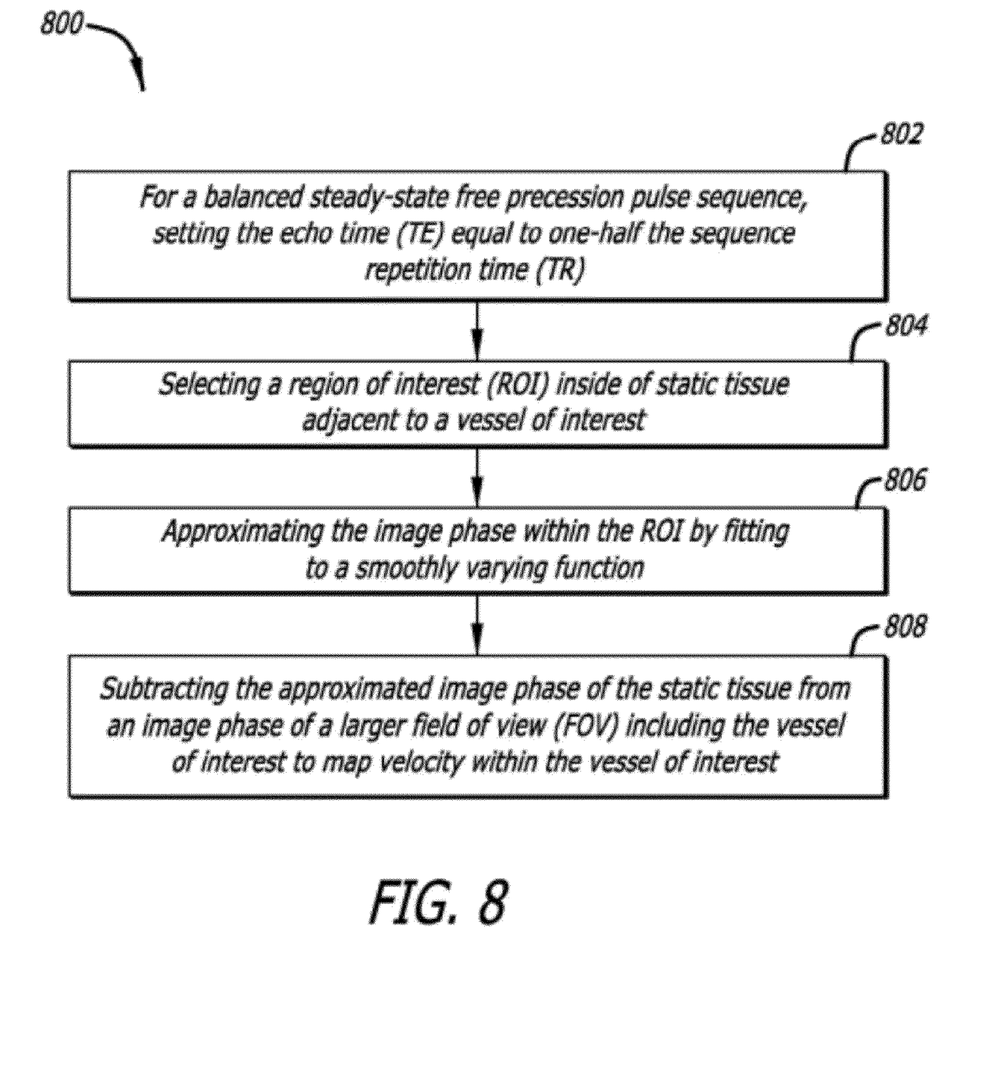
FIG. 8 depicts a diagrammatic outline of a method of referenceless phase velocity mapping using balanced SSFP, in accordance with exemplary embodiments of the present disclosure.

FIG. 8 depicts a diagrammatic outline of a method 800 of referenceless phase velocity mapping using balanced SSFP, in accordance with exemplary embodiments of the present disclosure. For the method 800, the echo time (TE) of a balanced SSFP pulse sequence can be set equal to one-half the sequence repetition time (TR), as described at 802. Phase-accrual because of resonance offsets can be refocused at this point in time.

A region of interest (ROI) inside static tissue can be selected (e.g., manually) that is adjacent to a vessel or structure of interest that has blood/liquid flow, as described at 804. The image phase within the static tissue ROI can be approximated (or modeled) by a smoothly varying function, e.g., a low-order polynomial or truncated sinusoidal series, as described at 806.

With continued reference to FIG. 8, the image phase of the static tissue as approximated at 804 can be subtracted from a larger field of view (FOV) including the vessel/structure of interest, as described at 808. As a result, the velocity of blood/liquid within the vessel/structure of interest can be mapped.

Accordingly, as SSFP image phase in static regions is often spatially smooth, embodiments of the present disclosure provide for subtraction of the background phase estimated from static regions in close proximity to vessels of interest can enable accurate blood flow velocity measurements without a phase reference. Methods and techniques of the present disclosure can utilize a spin-echo-like refocusing property of balanced SSFP, and on background phase removal using a low-order polynomial fit. Accurate background phase estimation may be difficult to achieve in imaging applications that contain little or no static tissue near the vessel.

One important example is cardiac flow imaging, where the heart chambers are surrounded by myocardium that is in constant motion. It may be possible to estimate background phase from the anterior and posterior chest walls, but the accuracy of background phase estimates inside the heart (far from the chest walls) would need to be checked carefully. Alternatively, background phase estimates can be derived from myocardial tissue in a relatively stable cardiac phase (e.g., mid-diastole or end-systole). It had been shown that in 2DFT balanced SSFP imaging, off-resonant spins moving through-plane can undergo significant transient oscillations, resulting in image artifacts. See Markl M, Alley M T, Elkins C J, Pelc N J. Flow effects in balanced steady state free precession imaging. Magn Reson Med 2003; 50:892-903; and Markl M, Pelc N J. On flow effects in balanced steady-state free precession imaging: Pictorial description, parameter dependence, and clinical implications. J Magn Reson Imaging 2004; 20:697-705; the entire contents of both of which are incorporated herein by reference.

These oscillations show a complicated dependence on flow rate, flip angle, slice thickness and profile, and degree of off-resonance. SSFP PC imaging may be relatively immune to these oscillations, as long as the same transient behavior is reproduced every R-R interval.

Embodiments of the present disclosure can rely on the absolute spin phase, and transient phase oscillations may therefore cause errors in the measured velocities for off resonance spins. Transient oscillations are unlikely to have had a significant role in the experiments performed in this. A good shim was obtained in all cases, and the most rapid flow occurred either in-plane or through a 6-cm 3DFT slab.

The sequence repetition time is an important consideration in balanced SSFP imaging, and should generally be kept as short as possible to maximize the separation between signal nulls in the SSFP spectral profile. The TR of the 1D velocity mapping sequence in FIG. 2 is slightly longer than a conventional SSFP imaging sequence with the same sequence parameters, due to the additional gradients required to null the first moment $m_{1,z}$ at the echo, and the requirement that TE=TR/2.

Accordingly, embodiments of the present disclosure can exploit the intrinsic "spin-echo like" refocusing property of balanced SSFP to achieve velocity-mapping in shorter scan times compared with conventional SSFP phase-contrast methods. In vivo 1D velocity mapping measurements obtained with the proposed technique are in excellent agreement with those obtained using SSFP PC-MRI, and are acquired in half the time. "7D" velocity mapping using three 3DFT image acquisitions has also been demonstrated as feasible.

The components, steps, features, objects, benefits and advantages that have been discussed are merely illustrative. None of them, nor the discussions relating to them, are intended to limit the scope of protection in any way. Numerous other embodiments are also contemplated. These include embodiments that have fewer, additional, and/or different components, steps, features, objects, benefits and advantages. These also include embodiments in which the components and/or steps are arranged and/or ordered differently.

In reading the present disclosure, one skilled in the art will appreciate that embodiments of the present disclosure can be implemented in hardware, software, firmware, or any combinations of such, and over one or more networks. Moreover, embodiments of the present disclosure can be included in or carried by various signals, e.g., as transmitted over a wireless RF or IR communications link or downloaded from the Internet.

Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

All articles, patents, patent applications, and other publications which have been cited in this disclosure are hereby incorporated herein by reference.

The phrase "means for" when used in a claim is intended to and should be interpreted to embrace the corresponding structures and materials that have been described and their equivalents. Similarly, the phrase "step for" when used in a claim embraces the corresponding acts that have been described and their equivalents. The absence of these phrases means that the claim is not intended to and should not be interpreted to be limited to any of the corresponding structures, materials, or acts or to their equivalents.

Nothing that has been stated or illustrated is intended or should be interpreted to cause a dedication of any component, step, feature, object, benefit, advantage, or equivalent to the public, regardless of whether it is recited in the claims.

The scope of protection is limited solely by the claims that now follow. That scope is intended and should be interpreted to be as broad as is consistent with the ordinary meaning of the language that is used in the claims when interpreted in light of this specification and the prosecution history that follows and to encompass all structural and functional equivalents.

The invention claimed is:

1. A method of referenceless phase velocity mapping using balanced steady-state free precession magnetic resonance imaging, the method comprising:
   with a MRI system, providing at least one balanced steady state free precession (SSFP) pulse sequence of RF pulses and balanced gradient pulses;
   setting an echo time (TE) of the at least one SSFP pulse sequence equal to about one half of a sequence repetition time (TR) to refocus all off-resonant spins at a time of image acquisition;
   for each of the at least one SSFP pulse sequences, acquiring a single MRI image;
   for each MRI image:
      selecting within the MRI image a region of interest (ROI) inside of static tissue adjacent to a vessel or structure of interest;
      approximating the image phase within the ROI of static tissue by fitting to a smoothly varying function; and
      obtaining a residual phase image $\Theta(r)$ by subtracting the approximated image phase of the static tissue from an image phase of a larger field of view (FOV) including the vessel or structure of interest; and
      collectively using the residual phase image $\Theta(r)$ derived from each MRI image to map velocity in at least one dimension within the vessel or structure of interest, wherein the number of dimensions is equal to the number of acquired MRI images.

2. The method of claim 1, wherein echo time (TE) is set exactly equal to one-half of the sequence repetition time (TR).

3. The method of claim 1, wherein providing a balanced steady state free precession pulse sequence comprises providing a plurality of phase encoding steps, wherein each phase encoding step comprises a slice selection gradient, a phase encoding gradient, and a readout gradient.

4. The method of claim 1, wherein the residual phase image is expressed in the form, $$\Theta(r)=\gamma[v_x(r)m_{1,x}(TE)+v_y(r)m_{1,y}(TE)+v_z(r)m_{1,z}(TE)],$$

wherein $m_{1,x}$, $m_{1,y}$, and $m_{1,z}$ are the gradient first moments at TE along x, y, and z, respectively.

5. The method of claim 1, wherein the SSFP pulse sequence comprises a 2DFT pulse sequence for single-slice 1D velocity mapping.

6. The method of claim 5, wherein mapping velocity comprises calculating velocity from image phase in a single acquisition.

7. The method of claim 6, wherein the velocity along x is calculated from the residual phase image according to, $$\Theta(r)=\gamma v_x m_{1,x}(TE).$$

8. The method of claim 1, wherein the SSFP pulse sequence comprises a 3DFT pulse sequence for volumetric flow imaging.

9. The method of claim 8, wherein mapping velocity comprises calculating velocity from image phase in each of three acquisitions.

10. The method of claim 9, wherein the velocity vector is calculated from the three residual phase images according to, $$\Theta^A=\gamma v_x m_{1,x}^A+\gamma v_z m_{1,z}^A,$$

$$\Theta^B=\gamma v_x m_{1,x}^B+\gamma v_z m_{1,z}^B,$$

$$\Theta^C=\gamma v_y m_{1,y}^C+\gamma v_z m_{1,z}^C.$$

11. The method of claim 1, wherein the smoothly varying function is a 3rd order polynomial.

12. The method of claim 1, wherein the smoothly varying function is a 2nd order polynomial.

13. The method of claim 1, wherein the image phase within the ROI of static tissue is fit to a smoothly varying function by least-squares fitting.

14. A MRI system for generating MRI images of an object, the MRI system comprising:
a static field generator configured to generate a static magnetic field $B_0$;
a gradient field generator configured to generate a time-varying gradient field G(r), parallel to $B_0$; and
an RF excitation pulse generator configured to generate an RF excitation field B1 and apply the field B1 to the object so that nuclear spins in the object flip at a flip angle;
the gradient field generator and the RF excitation pulse generator to provide at least one balanced steady state free precession (SSFP) pulse sequence of RF and gradient pulses, wherein an echo time (TE) of the at least one SSFP pulse sequence is set equal to about one half of a sequence repetition time (TR) such that all off-resonant spins are refocused at a time of image acquisition; and
a processing system configured and arranged to
 (i) for each of the at least one SSFP pulse sequences, acquire a single MRI image;
 (ii) for each MRI image:
  (a) select within the MRI image a region of interest (ROI) inside of static tissue adjacent to a vessel or structure of interest,
  (b) approximate the image phase within the ROI of static tissue by fitting to a smoothly varying function, and
  (c) subtract the approximated image phase of the static tissue from an image phase of a larger field of view (FOV) including the vessel or structure of interest to obtain a residual phase image $\Theta(r)$, and
  (iii) collectively use the residual phase image $\Theta(r)$ derived from each MRI image to map velocity in at least one dimension within the vessel or structure of interest, wherein the number of dimensions is equal to the number of acquired MRI images.

15. The system of claim 14, wherein the processing system comprises an image processing system.

16. The system of claim 15, wherein the processing system is configured and arranged to forming a velocity map calculated from residual phase images according to, $$\Theta(r)=\gamma[v_x(r)m_{1,x}(TE)+v_y(r)m_{1,y}(TE)+v_z(r)m_{1,z}(TE)]$$

wherein $m_{1,x}$, $m_{1,y}$, and $m_{1,z}$ are the gradient first moments at TE along x, y, and z, respectively.

17. The system of claim 14, wherein the SSFP pulse sequence comprises a 2DFT pulse sequence for single-slice 1D velocity mapping.

18. The system of claim 17, wherein mapping velocity comprises calculating velocity from image phase in a single acquisition.

19. The system of claim 18, wherein the velocity along x is calculated from the residual phase image according to, $$\Theta(r)=\gamma v_x m_{1,x}(TE).$$

20. The system of claim 14, wherein the SSFP pulse sequence comprises a 3DFT pulse sequence for volumetric flow imaging.

21. The system of claim 20, wherein mapping velocity comprises calculating velocity from image phase in each of three acquisitions.

22. The system of claim 21, wherein the velocity vector is calculated from the three residual phase images according to, $$\Theta^A=\gamma v_x m_{1,x}^A+\gamma v_z m_{1,z}^A,$$

$$\Theta^B=\gamma v_x m_{1,x}^B+\gamma v_z m_{1,z}^B,$$

$$\Theta^C=\gamma v_y m_{1,y}^C+\gamma v_z m_{1,z}^C.$$

23. An MRI controller system for a magnetic resonance imaging system, the system comprising:
an electronic controller configured and arranged to:
 (i) provide at least one balanced steady state free precession (SSFP) pulse sequence of RF and gradient pulses, wherein an echo time (TE) of the at least one SSFP pulse sequence is set equal to about one half of a sequence repetition time (TR) such that all off-resonant spins are refocused at a time of image acquisition;
 (ii) for each of the at least one SSFP pulse sequences, acquire a single MRI image;
 (iii) for each MRI image:
  (a) select within the MRI image a region of interest (ROI) inside of static tissue adjacent to a vessel or structure of interest,
  (b) approximate the image phase within the ROI of static tissue by fitting to a smoothly varying function, and
  (c) subtract the approximated image phase of the static tissue from an image phase of a larger field of view (FOV) including the vessel or structure of interest to obtain a residual phase image $\Theta(r)$, and
  iv) collectively use the residual phase image $\Theta(r)$ derived from each MRI image to map velocity in at least one dimension within the vessel or structure of interest, wherein the number of dimensions is equal to the number of acquired MRI images.

24. A method of balanced steady-state free precession magnetic resonance imaging using referenceless phase estimation, the method comprising:
- with an MRI system, providing at least one balanced steady state free precession (SSFP) pulse sequence of RF and gradient pulses, wherein an echo time (TE) of the at least one SSFP pulse sequence is set equal to about one half of a sequence repetition time (TR) such that all off-resonant spins are refocused at a time of image acquisition;
- for each of the at least one SSFP pulse sequences, acquiring a single MRI image;
- for each MRI image:
    - selecting within the MRI image a region of interest (ROI) inside of static tissue adjacent to a vessel or structure of interest,
    - approximating the image phase within the ROI of static tissue by fitting to a smoothly varying function, and
    - subtracting the approximated image phase of the static tissue from an image phase of a larger field of view (FOV) including the vessel or structure of interest to obtain a residual phase image $\Theta(r)$, and
- collectively using the residual phase image $\Theta(r)$ derived from each MRI image to map a desired attribute in at least one dimension within the vessel or structure of interest, wherein the number of dimensions is equal to the number of acquired MRI images.

25. The method of claim 24, wherein echo time (TE) is set exactly equal to one-half of the sequence repetition time (TR).

26. The method of claim 24, wherein the desired attribute is blood acceleration.

* * * * *